United States Patent [19]

Kalfus

[11] Patent Number: 4,568,962
[45] Date of Patent: Feb. 4, 1986

[54] PLASTIC ENCAPSULATED SEMICONDUCTOR POWER DEVICE MEANS AND METHOD

[75] Inventor: Martin A. Kalfus, Scottsdale, Ariz.

[73] Assignee: Motorola, Inc., Schaumburg, Ill.

[21] Appl. No.: 440,117

[22] Filed: Nov. 8, 1982

[51] Int. Cl.[4] .................. H01L 21/447; H01L 23/30; H01L 25/04

[52] U.S. Cl. ..................................... 357/72; 357/79; 357/75

[58] Field of Search ...................... 357/68, 72, 74, 81, 357/65, 79, 75, 76, 77

[56] References Cited

U.S. PATENT DOCUMENTS

| | | | |
|---|---|---|---|
| 3,723,836 | 3/1973 | Shekerjian et al. | 357/75 |
| 3,991,461 | 11/1976 | Anderson | 357/79 |
| 4,047,197 | 9/1977 | Schierz | 357/72 |
| 4,106,052 | 8/1978 | Shierz | 357/75 |
| 4,249,034 | 2/1981 | Fichot et al. | 357/72 |
| 4,390,891 | 6/1983 | Bahlinger | 357/75 |

Primary Examiner—Andrew J. James
Assistant Examiner—S. V. Clark
Attorney, Agent, or Firm—Robert M. Handy

[57] ABSTRACT

A means and method is provided for forming power devices using multiple semiconductor die. Typically, several semiconductor die or die assemblies with contact disks are mounted on a base plate in a spaced apart relationship. A compliant connector member which supports a massive power terminal, bridges between the die to which it is bonded via crushable contact dimples, to form an assembly. The assembly deforms during insertion into the mold to accommodate thickness variations and seat the outward faces of the terminal and base plate against the matching mold faces. When the plastic molding compound is injected into the mold there is a net outward force which seals the outward terminal, base and corresponding mold faces together to prevent encroachment of the plastic therebetween.

15 Claims, 10 Drawing Figures

*— PRIOR ART —*

PLASTIC ENCAPSULATED SEMICONDUCTOR POWER DEVICE MEANS AND METHOD

BACKGROUND OF THE INVENTION

1. Field of the Invention

This invention relates in general to improved semiconductor devices and, more particularly, to improved plastic encapsulated power devices and methods for making such devices.

2. Background Art

High power semiconductor devices are widely used but nonetheless costly. Their high cost stems principally from the use of expensive piece parts, and complicated means of assembly. The cost increases rapidly when it is desired to place more than one semiconductor die within the same power device enclosure. Thus, a need continues to exist for low cost, rugged, power semiconductor devices of simplified construction, particularly where multiple semiconductor die must be accommodated within the same package.

Accordingly, it is an object of the present invention to provide an improved semiconductor device of lower cost for a given performance rating.

It is a further object of this invention to provide an improved semiconductor device which readily accommodates more than one semiconductor die, especially when the die are to be electrically connected in parallel.

It is an additional object of this invention to provide an improved semiconductor power device accommodating one or more semiconductor die and having fewer piece parts than comparable prior art devices.

It is a further object of this invention to provide an improved plastic encapsulated power device having rugged and massive power terminals, and internal piece parts which when placed in a mold and injected with plastic, self-align and self-seal against the mold faces so that a predetermined terminal spacing can be achieved and external contact portions of the terminals can remain free of encapsulant.

It is an additional object of the present invention to provide an improved method for the manufacture of semiconductor devices.

It is a further object of the present invention to provide an improved method for the manufacture of plastic encapsulated semiconductor power devices, wherein dimensional variatons in the assembled piece parts are accommodated, and wherein the piece parts self-align and the terminals self-seal against the mold faces during mold closure and injection of the plastic molding compound.

SUMMARY OF THE INVENTION

The attainment of the foregoing and other objects and advantages is achieved through the present invention wherein there is provided a semiconductor die having a contact portion, a base member having a first face for supporting the semiconductor die and a second face adapted to seal against a first surface of a mold, a terminal member having a first face adapted to seal against a second surface of the mold, and a compliant connector member for supporting the terminal member and for coupling the terminal member to the contact portion of the semiconductor die. The compliant connector member includes deformable contact means for making contact to the semiconductor die or a die assembly. The compliant connector member is adapted to press the outward faces of the base member and the terminal member against the corresponding mold faces. A bonding means, typically solder, is used to join the base member, the semiconductor die, the compliant connector member, and the terminal member to form an assembly. The compliant connector member has a deformation range greater than the combined thickness tolerance variation of the several parts making up the assembly and the bonding means joining them together. Deformation occurs substantially in the contact means.

The compliant connector member, terminal member, and base member are arranged such that when placed in the mold, the outward faces of the terminal member and base member seat against the corresponding faces of the mold, and further such that, during molding, an injected liquified plastic creates a net outward directed force on the compliant connector member, the terminal member, and the base member which seals the outward faces of the terminal member and the base member against the corresponding mold faces so that plastic is substantially prevented from encroaching on these outward faces. A die assembly which includes a semiconductor die and one or more electrode disks may be used in place of the die alone.

A method for making plastic encapsulated semiconductor devices of a predetermined height is achieved by providing a base member, terminal member, compliant connecting means and one or more semiconductor die (or die assemblies) adapted for bonding, as described above; bonding together these several elements, typically by soldering, to form a flexible deformable assembly whose height exceeds the predetermined height; inserting the deformable assembly in a mold adapted to engage an outward face of the base member and an outward face of the terminal member; seating these outward faces against matching faces of the mold so as to align the terminal member and base member into a predetermined relationship and inhibit exposure of these outward faces to an encapsulant while allowing exposure of inner portions of the base member and terminal member, and of the compliant connector means, to the encapsulant so as to provide an outward directed imbalance of forces acting on the terminal member and base member during molding; closing the mold to compress the connector means to enhance the seating and reduce the height of the deformable assembly to the predetermined height; and injecting encapsulant into the mold under pressure so as to achieve this outward directed imbalance of forces and to maintain the outward faces of the terminal and base member against the matching mold faces so that encroachment of encapsulant on these outward faces is substantially prevented.

DETAILED DESCRIPTION OF THE PREFERRED EMBODIMENT

Figure 1:
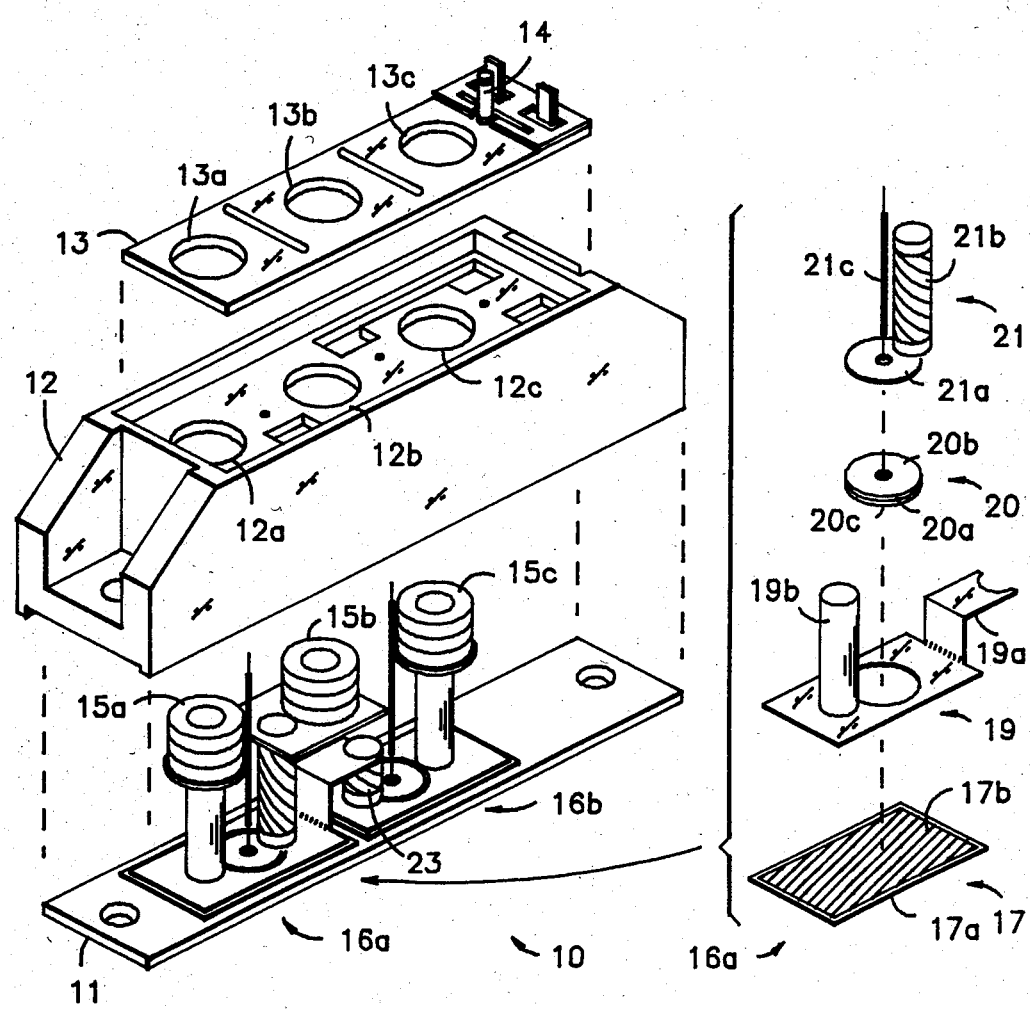
FIG. 1 shows an exploded view of a power semiconductor device, according to the prior art.

FIG. 1 shows an exploded view of a typical power semiconductor device of the prior art. Power semiconductor device 10 has copper base plate 11, plastic housing 12 and cover 13. Terminals 15a-c are provided to permit external connection to the device. Mounted on base plate 11 internal piece part assemblies 16a-b. Piece part assembly 16a includes lower electrode assembly 17, interconnecting strap 19, semiconductor die assembly 20, and upper contact assembly 21. Lower electrode assembly 17 comprises ceramic isolator 17a and copper electrode pad 17b. Mounted on electrode pad 17b are copper interconnectrng semiconductor die assembly 20. Copper interconnecting strap 19 includes lug portion 19a for making contact to adjacent piece part assembly 16b, and connecting post 19b for making contact to terminal 15a. Semiconductor die assembly 20 consists of semiconductor die 20a with lower contact electrode 20c. Upper contact assembly 21, comprising molybdenum electrode disk 21a and braided copper lead 21b, is attached to upper face 20b of semiconductor die assembly 20 and connected to terminal 15b. Optional control lead 21c may also be provided as a part of upper contact assembly 21. These piece parts are typically attached together by soldering. Piece part assembly 16b is generally similar to assembly 16a but without lug portion 19a. Lead 23 is also of braided copper.

After piece part assemblies 16a-b are assembled on base plate 11, housing 12 is slipped over assemblies 16a-b and attached to base plate 11 by an adhesive. Electrodes 15a-c protrude through holes 12a-c in housing 12. Cover 13, having holes 13a-c, is placed over electrodes 15a-c and sealed by means of an adhesive and sealant which is placed in the small cavity which remains in the top of housing 12, between housing 12 and cover 13. The space within housing 12 surrounding piece part assemblies 16a-b is then back-filled with nitrogen through filling tube 14 which is subsequently sealed.

It will be readily apparent to those of skill in the art that a large number of piece parts are required to construct device 10, and that the assembly procedure is correspondingly complex. In addition, the piece parts themselves are expensive. Semiconductor device 10 of FIG. 1 is illustrated as containing two interconnected semiconductor die. These can be diodes, transistors, thyristors, other devices, or a combination thereof. Where it is desired that the die be electrically connected to base plate 11, ceramic isolator 17a and electrode 17b can be omitted.

Figure 2A:
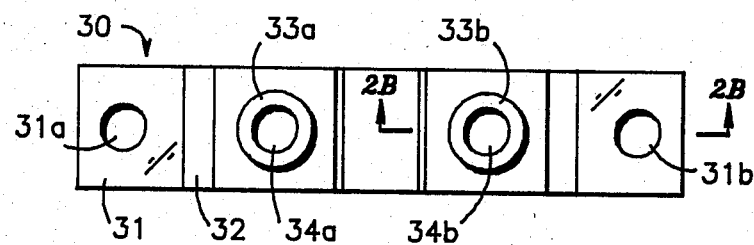
FIG. 2A is a top view of an improved semiconductor device, according to the present invention.
Figure 2B:
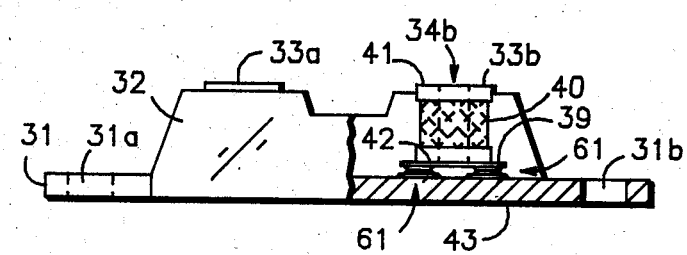
FIG. 2B is a side and partial cut-away view of the device of FIG. 2A.
Figure 2C:
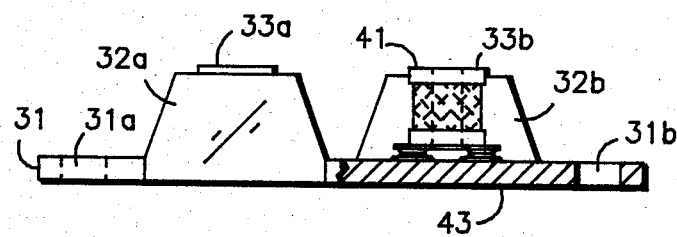
FIG. 2C is a side and partial cut-away view, similar to FIG. 2B, but illustrating a further embodiment of the present invention.

FIG. 2A shows a top view and FIGS. 2B-C show partial side and cut-away views of the improved semiconductor device of the present invention. Semiconductor device 30 comprises base member 31, typically of copper, having mounting holes 31a-b. Terminal members 33a-b for external connection and having therein threaded connection holes 34a-b are partially enclosed in plastic body 32. In the right half of FIGS. 2B-C plastic body 32 has been cut away to show the internal construction of terminal members 33a-b, and to show the presence of semiconductor die assemblies 61 mounted on base member 31 and connected to terminal member 33b by means of compliant connector member or means 39. The details of die assemblies 61 will be illustrated later. To provide good retention of terminal members 33a-b in plastic body 32, it is convenient that terminal members 33a-b have knurled region 40. Internal face 42 of terminal member 33b is coupled to compliant connector member 39, typically by soldering. Compliant connector member 39 seals the internal end of threaded connection hole 34b to prevent entry of plastic during molding. Outward face 41 of terminal member 33b is conveniently substantially flat, as is outward face 43 of base member 31. Terminal member 33a is similarly arranged.

FIG. 2C illustrates an alternative embodiment in which plastic body 32 is formed in two parts, part 32a covering the semiconductor die and piece parts associated with terminal 33a, and part 32b covering the die and parts associated with terminal 33b. This has the advantage of reducing the bending force experienced by base member 31 due to differential contraction of plastic body 32 following molding which can occur when body 32 extends continuously between terminals 33a-b.

Figure 3:
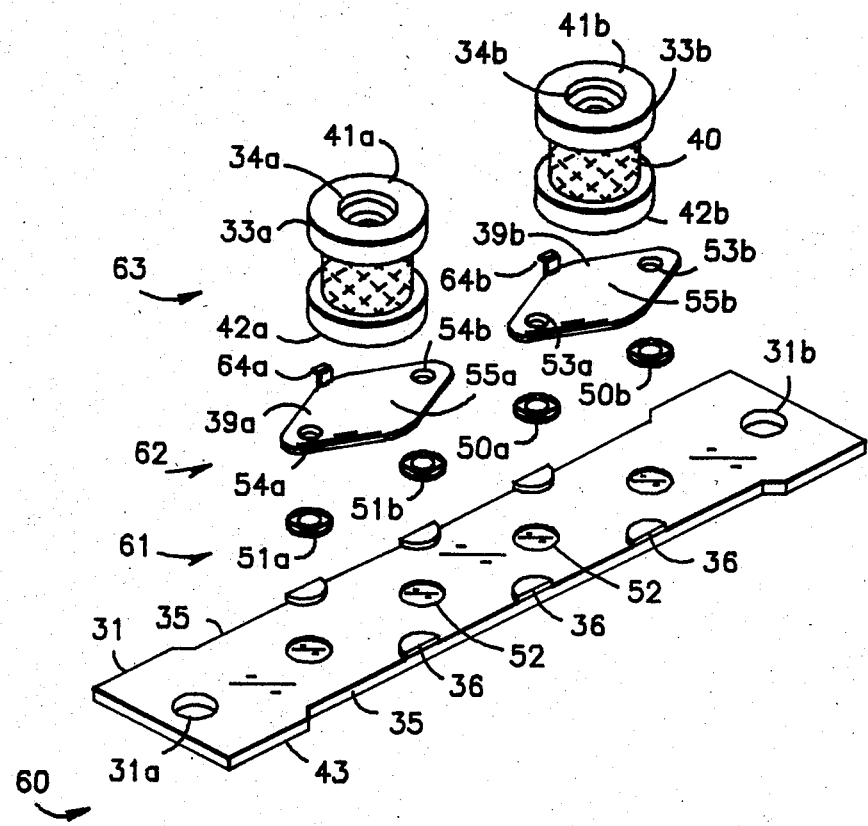
FIG. 3 shows an exploded view of the piece parts of a preferred embodiment of the semiconductor device of the present invention.

FIG. 3 shows an exploded view of the piece parts conveniently used in constructing device 30 of FIGS. 2A-C. Piece parts 60 of FIG. 3 comprises base member 31, semiconductor die assemblies 61, terminal members or means 63 and compliant connector means 62. Base member 31 has therein notches 35 and deformed portions 36 which aid in retaining plastic body 32. Base member 31 may optionally also have depressed regions 52 to aid in alignment and retention of semiconductor die or die assemblies 61 while piece parts 60 are being bonded together. Semiconductor die assemblies 61 may consist, optionally, of round or square semiconductor die each having two or more contact regions or electrodes thereon. Semiconductor die assemblies 61 can include metallic electrode and/or contact disks bonded to either face of the semiconductor die. This will be discussed in more detail later. Base member 31 has lower (outward) face 43.

FIG. 3 illustrates the situation in which die assemblies 61 comprise two pairs of rectifier (two terminal) die assemblies 50a-b and 51a-b. It will be recognized by those of skill in the art that other types of die could be used, e.g. transistors or thyristors, and additional leads provided.

Compliant connector means 62 comprising connector members 39a and 39b are used, respectively, to connect semiconductor die assemblies 51a-b and 50a-b to terminal members 41a and 41b. Compliant connector member 39a has contact means 54a for contacting semiconductor die assembly 51a and contact means 54b for contacting semiconductor die assembly 51b. Contact means 54a and 54b are conveniently in the form of depressed regions or dimples formed in connector member 39a and facing toward semiconductor die assemblies 51a-b. Compliant connector member 39a also has optional additional contact tang 64a which may be used to connect to additional components intnended to be enclosed within plastic body 32, or to an external signal lead. Tangs 64a-b also conveniently serve as alignment keys to aid in positioning compliant connector members 62 during assembly and bonding of piece parts 60, particularly so that contact means 54a-b, for example, align over semiconductor die assemblies 51a-b, and correspondingly for contact means 53a-b and assemblies 50a-b. Compliant connector member 39b has contact means 53a-b for making contact to semiconductor die assemblies 50a-b and optional tang 64b for contact and/or alignment. More than one tang can be used so that the alignment feature and contact feature are separate, and/or to permit multiple contacts. Face 42a of terminal member 33a is connected to face 55a of compliant connector member 39a. Face 42b of terminal member 33b is connected to face 55b of connector member 39b. Base member 31, semiconductor die assemblies 61, compliant connector means 62, and terminal members 63 are bonded together typically by soldering. Terminal members 33a-b have threaded connection holdes 34a-b, and base 31 has mounting holes 31a-b.

Figure 4A:
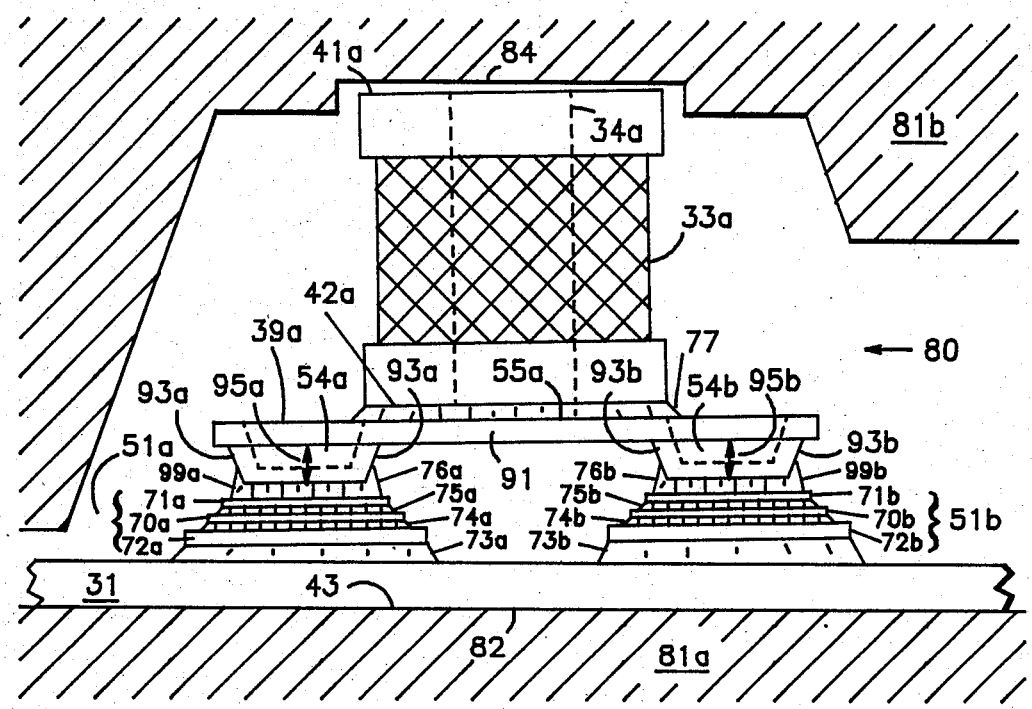
FIG. 4A shows a portion of the piece part assembly of the device of the present invention, in greater detail, and located in a mold, but prior to mold closure.
Figure 4B:
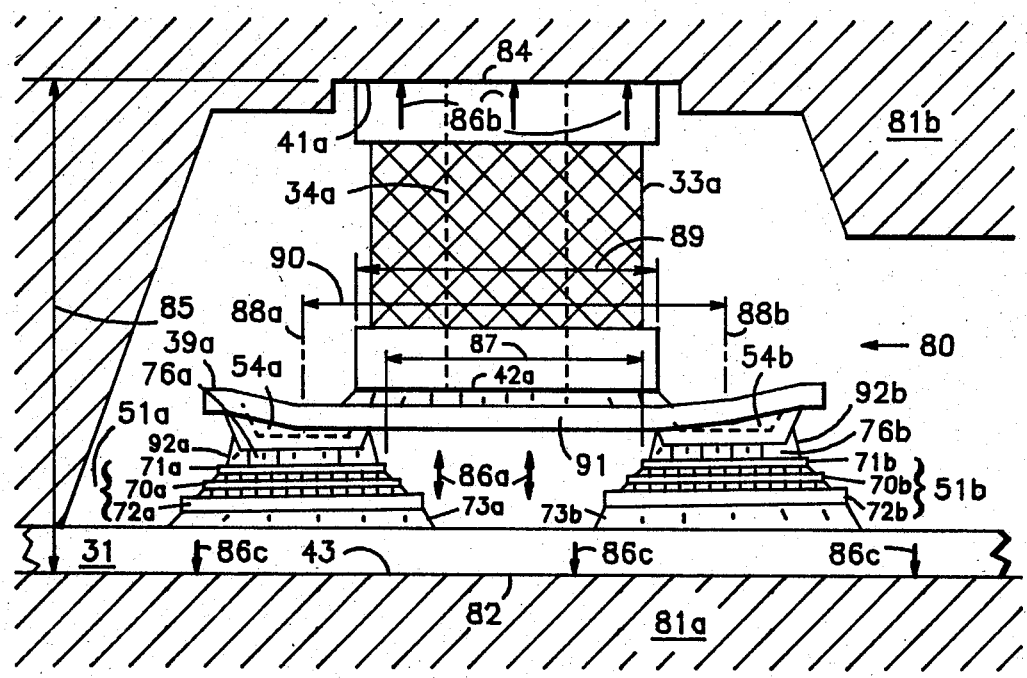
FIG. 4B shows the same portion as in FIG. 4A but after mold closure.

FIGS. 4A-B show, by way of illustration of the means and method of construction of device 30, portion 80 comprising approximately half of assembled piece parts 60. FIG. 4A illustrates the situation after piece parts 60 have been bonded together, i.e. assembled, and inserted in mold 81, but prior to complete closure of mold 81. Assembled piece part portion 80 comprises base member 31, semiconductor die assemblies 51a-b, compliant connector member 39a, and terminal member 33a. An important present invention is that compliant connector member 39a have sufficient compliance so as to be able to compensate for the variations in thickness which may occur during the fabrication of the individual piece parts, or the variations which may occur as piece parts 60 are bonded together.

In FIG. 4A, the construction of semiconductor die assemblies 51a-b are illustrated in greater detail. Semiconductor die assembly 51a comprises, for example, semiconductor die 70a, which may be of rectangular or circular shape, sandwiched between molybdenum electrodes 71a and 72a which may be of rectangular, circular, or other shape. Semiconductor die 70a and electrodes 71a and 72a are bonded together by bonding layers 74a and 75a, typically, of solder. Semiconductor die assembly 51b is of a similar construction and bonded together in a similar way using bonding layers 74b and 75b to connect die 70b to electrodes 72b and 71b respectively. Semiconductor die assemblies 51a-b are bonded, respectively, to contact means 54a-b of compliant connector member 39a and to base member 31 by bonding means 76a-b and 73a-b. Lead-tin (95:5) solders are conveniently used for bonding means 73a-b, 74a-b, 75a-b and 76a-b. Terminal member 33a is coupled to compliant connector member 39a by bonding means 77, also typically of the same solder. Methods for soldering piece parts together are well known in the art. While it is convenient that separate electrodes 71a-b and/or 72a-b be used in conjunction with semiconductor die 70a-b, it is not essential. Electrodes 71a-b and 72a-b could be formed as contacts directly on die 70a-b, bonding layers 74a-b and 75a-b eliminated.

Assembled piece part portion 80 has been placed in mold 81 between lower mold-half 81a a and upper mold-half 81b. Face 82 of mold portion 81a is designed to match or correspond to outward face 43 of base member 31. Mold face 84 of upper mold portion 81b is designed to match or correspond to outward surface 41a of terminal 33a. The height of assembled piece part portion 80 and the dimensions of mold 81 are chosen so that when faces 82 and 43 are in contact, faces 41a and 84 will also come in contact before mold 81 completely closes.

FIG. 4A illustrates the situation in which, due to the normal variations in manufacturing processes, bonding region 73b has a thickness greater than bonding region 73a so that terminal member 33a is slightly cocked with respect to base member 31, and outward face 41a of terminal member 33a is not parallel with corresponding mold face 84. It will be appreciated by those of skill in the art that while the variation in thickness has been illustrated as occurring in bonding layer 73b, variations in thickness can occur in any of the several bonding layers, and/or in any of the several piece parts comprising portion 80, that is, in terminal member 33a, in compliant connector member 39a, in bonding means 76a-b or 77 or in any of the elements or layers making up die assemblies 51a and/or 51b. These variations can produce an equivalent misalignment of outward face 41a with respect to face 84 of mold portion 81b, and/or can cause assembled portion 80 to be taller or shorter than the nominal value. In a similar way, variations in the other half (not shown in FIG. 4A) of assembled piece parts 60, can produce a misalignment of either or both of terminals 33a-b with respect to each other and/or base plate 31. FIGS. 4A-B are intended to exemplify all of these possibilities.

A feature of the present invention is that compliant connector members 39a-b have sufficient compliance or crushability so as to accommodate whatever thickness variations reasonably occur during manufacture. This insures that mold 81 can be closed despite height variations or misalignment of assembled portion 80, and without permanent damage to either mold 81 or assembled portion 80, in particular without damage to semiconductor die 70a-b.

FIG. 4B illustrates the same structure as shown in FIG. 4A but after closure of mold 81. In FIG. 4B, outward faces 43 and 41a are firmly seated against matching mold faces 82 and 84. The misalignment of assembled portion 80 and of face 41a of terminal member 33a with respect to mold face 84 has been eliminated, and overall height 85 of assembled portion 80 has been reduced to the predetermined final device dimensions which are determined by the spacing of the closed mold. In FIG. 4B compliant connector member 39a has deformed sufficiently to accommodate both the change in overall height of assembled portion 80 and to correct the height differential which resulted from, in this example, the unequal thicknesses of bonding layers 73a and 73b. Those of skill in the art will recognize that a small amount of shrinkage of the plastic can occur during cooling of the part after molding. This is readily measured and can be compensated for in the design of the mold so that any predetermined dimensional value (e.g. height) can be achieved.

It is important that surface 42a of terminal member 33a have basal area or extent 89 which exceeds separation 87 of electrodes or contacts 71a-b of semiconductor die assemblies 51a-b. It is convenient that extent 89 of surface 42a of terminal member 33a correspond approximately to distance 90 separating center lines 88a-b of semiconductor die assemblies 51a-b. This is to insure that the compression which takes place in compliant connector member 39a during the molding operation, occurs principally in contact means 54a–b as opposed to occurring by flexure of main body portion 91 of compliant connector member 39a. As a consequence the forces originating from the mold closure and transmitted from connector 33a through contact means 54a–b to semiconductor die 70a–b, are subustantially entirely compressive at semiconductor die 70a–b. These forces must also be distributed with sufficient uniformity across the surface of die 70a–b so as to avoid cracking die 70a–b and/or to avoid significant bending moments which would tend to cause, for example, cracking of bonding layer 76a–b at points 92a–b.

As illustrated in FIG. 4B, contact means 54a and 54b of compliant connector member 39a have compressed by different amounts to accommodate the difference in height of layers 73a and 73b of assembled portion 80. An analogous result occurs if the difference in height arises from other locations in assembled portion 80 or assembled piece parts 60.

Contact means 54a–b have the form, preferably, of bowl shaped depressions or dimples with inward sloping sidewalls 93a–b (see FIG. 4A). It is desirable that sidewalls 93a–b of contact means 54a–b approach or meet the surface of electrodes or contacts 71a–b respectively at an angle less than 90°. Under these conditions, when solder is used for bonding means 76a–b, solder fillet 99a–b is formed at the periphery of contact means 54a–b where contact means 54a–b are bonded to semiconductor die contacts 71a–b. This accommodates solder run-off and/or extrusion from between contact means 54a–b and contacts 71a–b which could otherwise cause shorts on or across die 70a–b.

Initial heights 95a–b of contact means 54a–b exceed the total anticipated deflection or compliance required: (1) to accommodate the expected variations and/or non-uniformity in the thickness of the piece parts and/or bonding means, so that no significant bending or deformation is required in body portion 91 of compliant connector member 39a; and (2) to allow for compression of assembled portion 80 and (assembled) piece parts 60 to the final predetermined height.

Figure 5A:
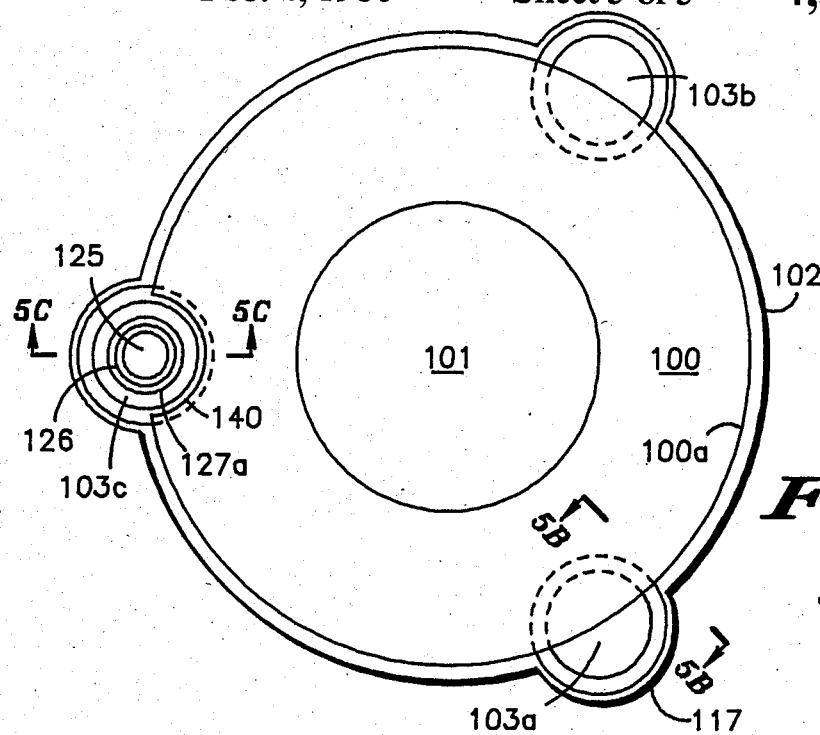
FIG. 5A shows a top view of a terminal and compliant connector member according to a further embodiment of the present invention.

FIG. 5A illustrates a top view of terminal member 100 having threaded hole 101 and coupled to compliant connector member 102 having contact portions or means 103a–c. Terminal member 100 is intended to serve as a means for making external connection to the device, analogous to the function of terminal members 33a–b of FIGS. 2A–C. By way of example, FIG. 5A illustrates the situation in which three semiconductor die assemblies are to be coupled together by a single compliant connector member attached to a common terminal. For clarity the details of the semiconductor die assemblies have been omitted from FIG. 5A. Examples of the die assemblies are included FIGS. 5B–C. Contact means 103a–b of connector member 102 illustrate a configuration useful for two terminal devices, e.g. rectifiers. Contact means 103c of compliant connector member 102 illustrates a contact configuration useful for three terminal devices, e.g. a thyristor, wherein center control gate lead 125 surrounded by insulating sleeve 126 passes through central hole 127 in contact means 103c. It will be readily apparent to those of skill in the art that many semiconductor die can be coupled together in this fashion. A multiplicity of leads can also be accommodated.

Figure 5B:
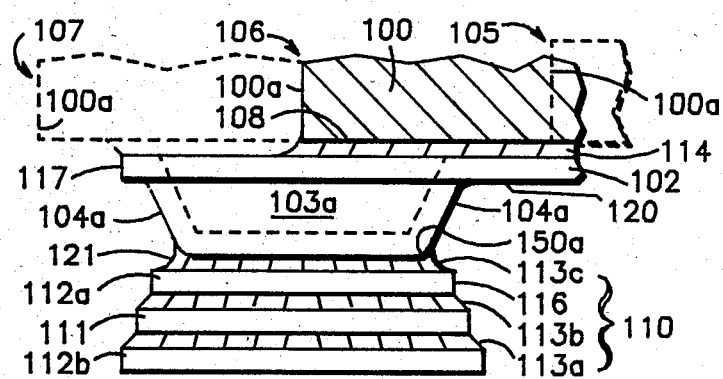
FIG. 5B shows a side view of a first portion of the terminal and connector member of FIG. 5A, further including a semiconductor die assembly.

FIG. 5B shows a portion of a sideview of terminal member 100 and compliant connector member 102 of FIG. 5A in the vicinity of contact means 103a, including two terminal semiconductor die assembly 110 consisting of semiconductor die 111 and contact portions (e.g. disks) 112a–b. Bonding means 113a–c couple together contact portion 112b, semiconductor die 111, contact portion 112a, and contact means 103a of compliant connector member 102. Bonding means 114 couples compliant connector member 102 and terminal member 100. A further bonding means, not shown here, couples contact 112b to base member 31, as for example layer 73a of FIG. 4A.

FIG. 5B further illustrates several possible positions of perimeter 100a of base portion 108 of terminal member 100; position 105 located to the right of inner edge 116 of contact 112a, i.e. further toward the center of connector member 102; position 106 corresponding roughly to the center line of semiconductor die assembly 110; and position 107 located beyond external perimeter or boundary 117 of compliant connector member 102. It has been found that when perimeter 100a is in position 105 that compliant connector member 102 has a tendency to bend in location 120 resulting in failure of bonding layer 113c approximately in location 121 or at corresponding positions in layers 113a–b. Failure can also occur by cracking of semiconductor die 111. As perimeter 100a is moved radially outward from location 105, that is, to the left in FIG. 5B, the loading on contact means 103a becomes increasingly uniform. The tendency for compliant connector member 102 to bend in region 120 disappears and compliance is obtained substantially by deformation of contact means 103a. Any position that is substantially outboard of perimeter 116 of semiconductor die contact 112a is useful; however, it has been found that better results are obtained if boundary 100a is located more centrally over contact means 103a, as for example in the general vicinity of location 106. Extending boundary 100a beyond perimeter 117, for example, to position 107, while it may further increase the loading uniformity, does not produce a significant further improvement in bond integrity, reliability, and/or manufacturing yield, but does result in increased material costs.

Figure 5C:
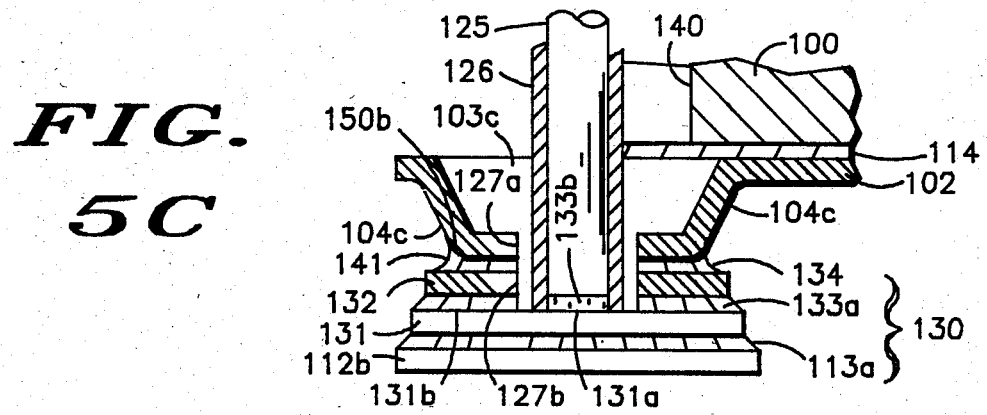
FIG. 5C shows a side view of a second portion of the terminal and connector member of FIG. 5A, further including a semiconductor die assembly.

FIG. 5C shows a portion of a cross-section and sideview of terminal member 100 and compliant connector member 102 of FIG. 5A in the vicinity of contact means 103c, but further including three-terminal semiconductor die assembly 130. Die assembly 130 comprises semiconductor die 131, lower contact portion 112b and upper washer shaped contact portion 132. Control lead 125 covered by insulating sleeve 126 passes through hole 127a in contact means 103c and hole 127b in contact portion 132. Lead 125 attaches to central portion 131a of die 131 by bonding means 133b. Washer shaped contact portion 132 attaches to peripheral portion 131b of die 131 by means of bonding layer 133a. Bonding means 134 is conveniently used to couple washer shaped contact portion 132 to contact means 103c. Layers 133a–b and 134 are conveniently of solder although other electrically conductive bonding means can be utilized. Terminal member 100 is relieved at 140 to allow for passage of lead 125. It will be further apparent from FIGS. 5B–C, that providing sloped sidewalls 104a,c on contact means 103a,c promotes the formation of solder filet 121,141. It is desirable that corners 150a or 150b where sidewalls 104a or 104c meet die contact portions 112a or 132 respectively, be within the perimeter of contact portions 112a or 132 so as to avoid spillover of the solder or other bonding means which would cause shorts across die 111 or 131 respectively.

Referring again to FIG. 4B, when a liquified plastic encapsulant is injected into mold 81, substantial outward directed forces are exerted by the plastic on mold 81. The pressure is often quite high, typically 150-400 psi (1-2.8 MPa) and there is a significant tendency of the liquid plastic material to force its way between mating surfaces, as for example between surface 41a and surface 84, and between surfaces 82 and 43. The peak pressure within the mold may be sufficient to overcome the mechanical force being supplied by compliant connector member 39a which holds, for example, surfaces 41a and 84 together. This would allow the encroachment of plastic onto outward face 41a of terminal member 33a and into tapped hole 34a, both of which are undesirable. However, the arrangment of terminal member 33a, compliant connector member 39a, semiconductor die assemblies 51a-b, and base member 31 are such that the liquid encapsulant exerts an unbalanced hydrostatic force 86a against the inner surfaces of compliant connector member 39a, base member 31 and terminal member 33a such that the encapsulant itself produce net outward directed forces 86b-c tending to hold faces 41a and 84, and faces 43 and 82 in intimate contact. These net outward directed forces are in addition to the outward directed mechanical forces provided by compliant connector member 39a. When combined they insure that these matching (e.g. faces 41a and 84; and faces 43 and 82) faces remain firmly seated together during molding and that no plastic encroaches therebetween. As used herein the words "net force" or "outward directed force" are intended to refer to the sum of the mechanical and hydrostatic forces which combine to hold the matching faces together.

The following is an example of the practice of the method of the invention. Base plate 31 (FIG. 3) is fashioned typically from 0.125 inch (3.2 mm) copper to which is applied a thin plating of nickel. Mounting holes 31a-b, notches 35, deformed portions or bosses 36, and optional recesses 52 may be formed by any mechanical shaping means. Stamping is particularly convenient. Such means are well known in the art. Semiconductor die assembly 61 is conveniently formed by taking a rectangular semiconductor die, typically of silicon, having the necessary number of semiconductor junctions and appropriate contact regions, and sandwiching the die between nickel plated molybdenum disks. These are coupled to the semiconductor die conveniently by means of a lead-tin solder. Means for attaching metal electrodes to semiconductor die are well known in the art. Compliant connector members 39a-b are conveniently of 20 mil (0.5 mm) thick copper.

Contact means 53a-b, 54a-b of compliant connector means 62 of FIGS. 3-4 or 103a-c of FIG. 5 are conveniently provided in the shape of bowl shaped depressions having sloped sidewalls. It has been found that a useful depth for these bowl shaped depressions is approximately one to three times the thickness of connector members 39a-b, that is, approximately 20-60 mils (0.5-1.5 mm) where members 39a-b are 20 mil (0.5 mm) thick. A narrower range of one to two times the thickness of connector members 39a-b is convenient, with 1 to 1.5 times the thickness being preferred. Stamping is a convenient means of forming these bowl shaped contact means. It is also desirable that compliant connector means 62 (e.g. 39a-b) be annealed following formation of contact means 53a-b, 54a-b, and/or 103a-c to a dead soft condition to facilitate deformation or crushing of the contact portions during the molding operation without damage to the semiconductor die, die contacts and/or bonding means. Terminal members 63 or 100 are conveniently formed from brass covered with a thin nickel plate. The sides are knurled to provide a good grip to the plastic encapsulant, and a central through-hole is provided which is tapped to give a convenient means for external connection. A feature of the present design is that the threaded connection holes in the terminal members (e.g. holes 34a-b in members 63) can pass entirely through the terminal members and yet not become occluded with plastic encapsulant during the molding process. This results from two circumstances; (1) that compliant connector members 62 completely cover interior faces 42a-b of terminal members 63 after assembly of piece parts 60, and (2) that a tight seal is maintained against outward faces 41a-b during molding. Using a through hole in terminal members 63 and 100 is particularly desirable since through holes are much less expensive to bore and thread than blind holes. Thus the arrangement of parts in the present invention provides for lower piece part cost.

Base 31, semiconductor die assemblies 61, compliant connector members 62, and terminal members 63 are assembled in a stacked relationship with bonding means, such as solder pre-forms located, therebetween. The stacked assembly is passed through a hydrogen furnace to bond piece parts 60 made up of elements 31, 61, 62, and 63 together. The total height of the assembly is arranged to be greater than the desired finished height of the device. The difference will be taken up during compression of the assembly in the mold. The compliant connector member insures that the assembly is both compressible and deflectable to the extent necessary to correct for normal thickness variations in the individual piece parts and the bonding means used for coupling them together, and for any slight irregularities in the assembly and bonding process.

The bonded assembly is inserted into mold 81 adapted to engage outward face 43 of base member 31 and outward faces 41a-b of terminal members 33a-b (see FIGS. 3 and 4A-B). Outward faces 41a-b and 43 are seated against matching faces 84 and 82, respectively, of mold 81 so as to align terminal members 33a-b and base member 31 into their predetermined relationships and inhibit exposure of outward faces 41a-b and 43 to the encapsulant while allowing the inner portions of base member 31, terminal members 33a-b and compliant connector means 39a-b to be exposed to the encapsulant so as to provide outward directed imbalance of forces 86a-c which act on or through terminal members 33a-b and base member 31 during molding. The mold is closed to compress compliant connector means 39a-b, to reduce the height of assembled piece parts 60 to predetermined finished height 85, and to enhance the seating of outward faces 41a-b and 43 against mold faces 84 and 82. Plastic encapsulant is injected into the mold under pressure so as to enclose assembled piece parts 60 and achieve outward directed forces 86b-c necessary to maintain outward faces 41a-b and 43 of terminals 33a-b and base member 31, respectively, against matching mold faces 84 and 82, so that encroachment of encapsulant on outward faces 41a-b and 43 is substantially prevented. Injection molding materials suitable for encapsulating semiconductor devices are well known in the art. After an appropriate curing time, which depends upon the material being used and which is readily determinable by experiment, the mold is opened and the finished device removed.

Thus, it is apparent that there has been provided in accordance with this invention improved semiconductor devices, particularly power devices adapted to accommodate more than one semiconductor die, and which have fewer piece parts than comparable prior art devices. Additionally, there has been provided in accordance with this invention, an improved method for the fabrication of such devices wherein a minimum number of piece parts are utilized, wherein the piece parts are arranged in such a fashion that the assembled and bonded piece parts automatically align and self-seal against the mold faces during mold closure, and wherein the self-sealing is reinforced by a net imbalance of forces produced during the injection of the plastic molding compound.

While the invention has been described in terms of certain recommended materials and shapes, it will be readily apparent to those of skill in the art that both the invented structure and method are useful with other materials and shapes and a wide variety of semiconductor die of different configurations, which may differ in detail but preserve the central relationships among the various elements. Accordingly, it is intended to encompass all such variations as fall within the scope of the invention.

I claim:

1. A molded semiconductor device comprising:
a semiconductor die having a contact portion;
a base member having a first face for supporting said semiconductor die and a second face for sealing against a first surface of an encapsulation mold;
a terminal member having a first face for sealing against a second surface of said mold;
a compliant connector member for supporting said terminal member and for coupling said terminal member to said contact portion of said semiconductor die, wherein said compliant connector member presses said second face of said base member against said first surface of said mold and said first face of said terminal member against said second surface of said mold;
bonding means for joining said base member, said semiconductor die, said compliant connector member, and said terminal member in a stacked relation; and
encapsulation means comprising a pressurizable liquifiable molding compound surrounding said compliant connector member and semiconductor die.

2. The device of claim 1 wherein said molding compound is pressurized and liquified during molding and exerts a net force on said terminal member, said compliant connector member and said base member to seal said first face of said terminal member against said second surface of said mold and said second surface of said base member against said first surface of said mold to control dimensions of said semiconductor device after molding and substantially prevent molding compound from penetrating between said first face of said terminal member and said second surface of said mold, and between said second surface of said base member and said first surface of said mold.

3. The device of claim 1 further comprising at least two semiconductor die each having a contact portion and each supported in spaced apart relationship by said base member, and wherein said compliant connector member has at least two contact means for contacting said contact portions of said at least two semiconductor die, each said contact means being substantially aligned facing one of said at least two contact portions.

4. The device of claim 3 wherein each said contact means comprises a formed region protruding from said compliant connector in the direction of said facing contact portion, each said formed region including a deformable portion.

5. The device of claim 4 wherein a part of said deformable portion of each said formed region meets said contact portion at an angle less than ninety degrees.

6. The device of claim 5 wherein said contact means are separated by a first lateral distance and wherein said terminal member is coupled to said compliant connector member so as to substantially span said first lateral distance, so that flexure of said compliant connector member occurs substantially in said deformable portion.

7. The device of claim 1 wherein said compliant connector member has a deflection range greater than the combined thickness tolerance variations of said base, said semiconductor die, said compliant connector member, said terminal member, and said bonding means, and wherein said compliant connector member has contact means aligned facing said contact portion of said semiconductor die.

8. The device of claim 7 wherein each said contact means comprises a formed region protruding from said compliant connector in the direction of said facing contact portion, each said formed region comprising a deformable portion.

9. The device of claim 8 wherein a part of said deformable portion of each said formed region meets said contact portion at an angle less than ninety degrees.

10. The device of claim 9 wherein said contact means are separated by a first lateral distance and wherein said terminal member is coupled to said compliant connector member so as to substantially span said first lateral distance, so that flexure of said compliant connector member occurs substantially in said deformable portion.

11. A semiconductor power device with plastic encapsulation comprising:
a base member having therein one or more plastic engagement means for gripping said plastic encapsulation;
two or more semiconductor die coupled to said base member in spaced apart relationship by a first bonding means;
at least one terminal member having an axis arranged substantially perpendicular to said base member and a basal portion substantially perpendicular to said axis and located facing said base member;
at least one compliant connecting means for coupling said spaced apart semiconductor die and said basal portion of said terminal member, wherein said compliant connector means is attached to said basal portion by a second bonding means, wherein said at least one compliant connecting means has contact members aligned over said spaced apart semiconductor die, and wherein each said contact member comprises a deformable portion coupled to said semiconductor die by a third bonding means;
wherein said basal portion has a lateral extent sufficient to at least extend between said spaced apart semiconductor die; and
pressurizable liquifiable plastic encapsulant for providing during molding an outward directed force between said base member, said at least one terminal member, and a mold for holding said base and terminal members, to seal said terminal member and said base member against said mold.

12. The device of claim 11 wherein at least one of said at least one terminal members has a hole for external connection parallel to said axis and penetrating through said terminal member but not through said compliant connector means.

13. The device of claim 12 wherein said deformable portion comprises a compressable dimple.

14. The device of claim 13 wherein each said two or more semiconductor die comprise at least two contact regions adapted to couple to said base member and contact member, and wherein each said contact region are of metal which has a thermal coefficient of expansion intermediate between said semiconductor die, and said base member or contact member.

15. The device of claim 14 wherein said first, second, and third bonding means comprise soldering.

* * * * *